United States Patent
Ohata

(10) Patent No.: US 10,568,216 B2
(45) Date of Patent: Feb. 18, 2020

(54) COMPOSITE SHEET, ITS PRODUCTION METHOD, RESIN MULTILAYER SUBSTRATE, AND ITS PRODUCTION METHOD

(71) Applicant: Murata Manufacturing Co., Ltd., Nagaokakyo-shi, Kyoto-fu (JP)

(72) Inventor: Hiroyuki Ohata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 218 days.

(21) Appl. No.: 15/611,891

(22) Filed: Jun. 2, 2017

(65) Prior Publication Data

US 2017/0273194 A1    Sep. 21, 2017

Related U.S. Application Data

(63) Continuation of application No. PCT/JP2016/055473, filed on Feb. 24, 2016.

(30) Foreign Application Priority Data

Mar. 6, 2015    (JP) .................. 2015-044655

(51) Int. Cl.
| | | |
|---|---|---|
| *H05K 3/46* | (2006.01) | |
| *H05K 1/03* | (2006.01) | |
| *B05D 3/06* | (2006.01) | |
| *B05D 7/04* | (2006.01) | |
| *B05D 3/00* | (2006.01) | |

(52) U.S. Cl.
CPC ............... *H05K 3/46* (2013.01); *B05D 3/007* (2013.01); *B05D 3/063* (2013.01); *B05D 7/04* (2013.01); *H05K 1/0353* (2013.01); *H05K 2201/0141* (2013.01)

(58) Field of Classification Search
CPC ........ B32B 27/00; B05D 3/063; B05D 3/007; B05D 7/04; H05K 3/46; H05K 3/022; H05K 1/0353; H05K 2201/0154; H05K 3/4632; H05K 2201/0141
See application file for complete search history.

(56) References Cited

U.S. PATENT DOCUMENTS

| | | | |
|---|---|---|---|
| 5,719,354 A | 2/1998 | Jester et al. | |
| 2002/0172021 A1* | 11/2002 | Seri .................. | H01L 23/49894 361/760 |
| 2004/0061105 A1 | 4/2004 | St. Lawrence et al. | |
| 2015/0294754 A1* | 10/2015 | Ohata .................. | H05K 3/4632 428/195.1 |
| 2015/0299405 A1 | 10/2015 | Ohata | |
| 2015/0305150 A1 | 10/2015 | Ohata | |

FOREIGN PATENT DOCUMENTS

| | | |
|---|---|---|
| JP | 8-97565 A | 4/1996 |
| JP | 2006-501688 A | 1/2006 |
| JP | 2014-111699 A | 6/2014 |
| JP | 2016-062954 A | 4/2016 |
| WO | 2014/109139 A1 | 7/2014 |
| WO | 2014/109199 A1 | 7/2014 |
| WO | 2014/188830 A1 | 11/2014 |
| WO | 2015/029783 A1 | 3/2015 |

OTHER PUBLICATIONS

Official Communication issued in International Patent Application No. PCT/JP2016/055473, dated May 24, 2016.

* cited by examiner

*Primary Examiner* — Cheng Yuan Huang
(74) *Attorney, Agent, or Firm* — Keating & Bennett, LLP

(57) ABSTRACT

A composite sheet includes a resin layer including a liquid crystal polymer as a main material and a first surface and a second surface facing away from each other, a conductor foil disposed on the first surface, and a powder layer including a powder of a liquid crystal polymer as a major component and located on an entirety of the second surface.

8 Claims, 11 Drawing Sheets

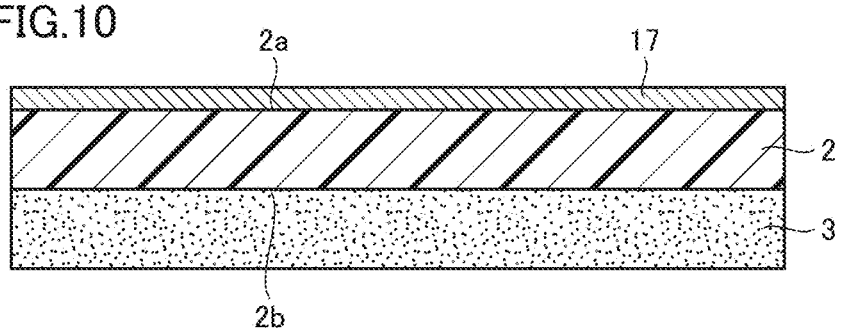
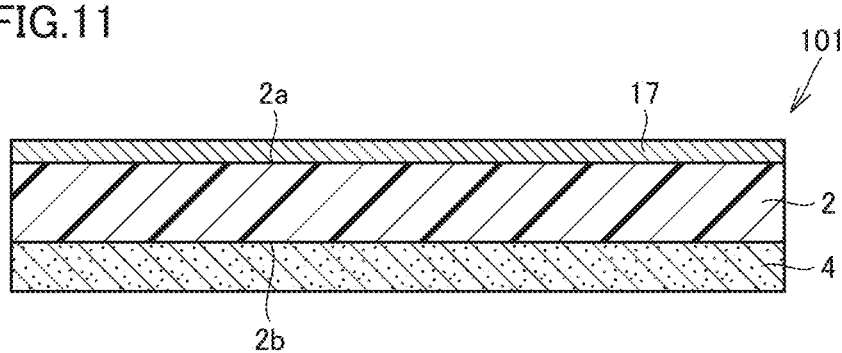

COMPOSITE SHEET, ITS PRODUCTION METHOD, RESIN MULTILAYER SUBSTRATE, AND ITS PRODUCTION METHOD

CROSS REFERENCE TO RELATED APPLICATIONS

This application claims the benefit of priority to Japanese Patent Application No. 2015-044655 filed on Mar. 6, 2015 and is a Continuation Application of PCT Application No. PCT/JP2016/055473 filed on Feb. 24, 2016. The entire contents of each application are hereby incorporated herein by reference.

BACKGROUND OF THE INVENTION

1. Field of the Invention

The present invention relates to a composite sheet, its production method, a resin multilayer substrate, and its production method.

2. Description of the Related Art

An example of a technique used to stack sheets of a liquid crystal polymer (also referred to as "LCP") to obtain a product is described in Japanese Patent Laying-Open No. 8-97565.

When resin sheets with LCP as a main material are stacked, with a conductive pattern between at least some of the sheets, to form a stack which in turn entirely undergoes thermocompression bonding to obtain a resin multilayer substrate, the resin may flow during the thermocompression bonding and the position of the conductive pattern disposed inside the stack may vary undesirably. Such a displacement of the conductive pattern poses a problem. When conductive patterns are disposed to overlap at the same position across a plurality of different layers as seen in a plan view, in particular, the positions of the conductive patterns disposed inside the stack, easily vary, which poses a problem.

SUMMARY OF THE INVENTION

Accordingly, preferred embodiments of the present invention provide a composite sheet which reduces an amount of variation of a position of a conductive pattern attributed to a flow of resin during thermocompression bonding, its production method, a resin multilayer substrate, and its production method.

A composite sheet according to a preferred embodiment of the present invention includes a resin film including a liquid crystal polymer as a main material and a first surface and a second surface facing away from each other; a conductor film disposed on the first surface; and a powder layer including a powder of a liquid crystal polymer as a main material and provided on an entirety of the second surface.

Preferably, at least one of the second surface and the powder included in the powder layer undergoes at least one of ultraviolet ray exposure, a plasma treatment, and a corona discharge treatment.

Preferably, at least a portion of the powder included in the powder layer is fibrillated.

Preferably, at least a portion of the powder included in the powder layer is obtained by crushing a biaxially oriented liquid crystal polymer sheet.

A method for producing a composite sheet according to a preferred embodiment of the present invention includes preparing a resin film including a liquid crystal polymer as a main material and a first surface and a second surface facing away from each other, and includes a conductor film disposed on the first surface; applying a paste with a powder of a liquid crystal polymer dispersed therein to an entirety of the second surface; and drying the paste applied on the second surface.

Preferably, the applying is preceded by subjecting at least one of the second surface and the powder to at least one of ultraviolet ray exposure, a plasma treatment, and a corona discharge treatment.

Preferably, at least a portion of the powder included in the paste is fibrillated.

Preferably, at least a portion of the powder included in the powder layer is obtained by crushing a biaxially oriented liquid crystal polymer sheet.

A method for producing a resin multilayer substrate according to a preferred embodiment of the present invention includes preparing a plurality of composite sheets; forming a stack by stacking the prepared plurality of composite sheets; and compressing and heating the stack to integrate the stack, the plurality of composite sheets each including a resin film which includes a liquid crystal polymer as a main material and a first surface and a second surface facing away from each other, a conductor film disposed on the first surface, and a powder layer including a powder of a liquid crystal polymer as a main material and formed on an entirety of the second surface, in the forming the stack by stacking, the conductor film includes at least a portion overlapping the powder layer.

Preferably, in the forming the stack by stacking or the compressing and heating, a portion of the powder layer that overlaps the conductor film at least partially moves to a side to avoid the conductor film.

Preferably, at least a portion of the powder included in the powder layer is fibrillated.

Preferably, at least a portion of the powder included in the powder layer is obtained by crushing a biaxially oriented liquid crystal polymer sheet.

A resin multilayer substrate according to a preferred embodiment of the present invention includes a structure in which a stack includes a plurality of any of the composite sheets described above.

Preferred embodiments of the present invention reduce an amount of variation of a position of a conductive pattern attributed to a flow of resin during thermocompression bonding.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 10 illustrates a third step of the method for producing the composite sheet according to the first preferred embodiment of the present invention.

FIG. 11 illustrates a fourth step of the method for producing the composite sheet according to the first preferred embodiment of the present invention, and is a cross section of a composite sheet according to a second preferred embodiment of the present invention.

DETAILED DESCRIPTION OF THE PREFERRED EMBODIMENTS

First Preferred Embodiment

Figure 1:
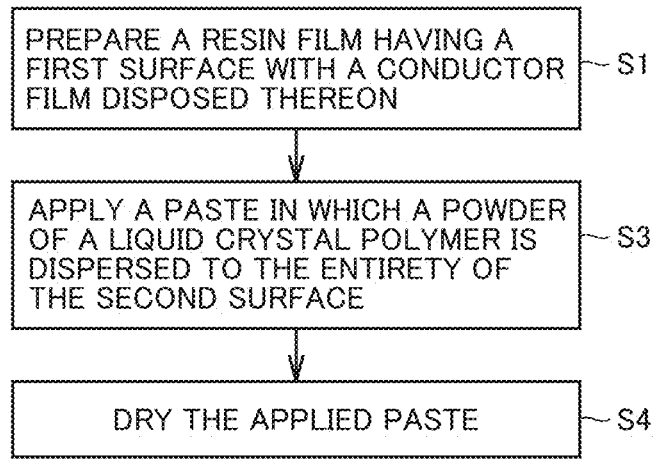
FIG. 1 is a flowchart of a method for producing a composite sheet according to a first preferred embodiment of the present invention.

With reference to FIG. 1 to FIG. 11, a method for producing a composite sheet according to a first preferred embodiment of the present invention will be described. FIG. 1 is a flowchart of the method for producing the composite sheet according to the present preferred embodiment. The method for producing the composite sheet according to the present preferred embodiment includes a step S1 of preparing a resin film which contains a liquid crystal polymer as a main material, includes a first surface and a second surface facing away from each other, and a conductor film disposed on the first surface; a step S3 of applying a paste in which a powder of a liquid crystal polymer is dispersed to the entirety of the second surface; and a step S4 of drying the paste applied on the second surface.

Before specifically describing the method for producing the composite sheet according to the present preferred embodiment, the powder of the liquid crystal polymer (hereinafter also referred to as "LCP") used with this production method will first be described. This is because when performing the method for producing the composite sheet according to the present preferred embodiment, it is preferable to previously prepare a paste in which a powder of an LCP is dispersed.

Figure 2:
FIG. 2 shows an LCP powder used in the method for producing the composite sheet according to the first preferred embodiment of the present invention.
Figure 3:
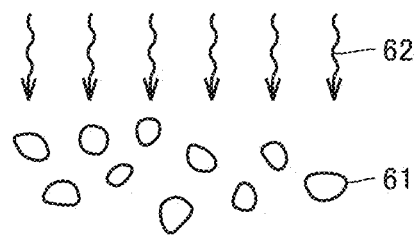
FIG. 3 illustrates how the LCP powder used in the method for producing the composite sheet according to the first preferred embodiment of the present invention is exposed to a plasma.
Figure 4:
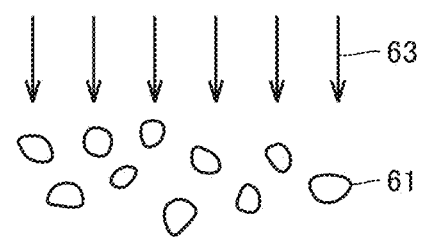
FIG. 4 illustrates how the LCP powder used in the method for producing the composite sheet according to the first preferred embodiment of the present invention is exposed to ultraviolet rays.

FIG. 2 shows a powder of an LCP (hereinafter referred to as an "LCP powder") 61. LCP powder 61 is shown schematically. While LCP powder 61 may be as it is, preferably, LCP powder 61 undergoes a surface treatment. As the surface treatment, at least one of ultraviolet ray exposure, a plasma treatment, and a corona discharge treatment is performed. For example, as shown in FIG. 3, LCP powder 61 is exposed to a plasma 62. Alternatively, as shown in FIG. 4, LCP powder 61 is exposed to ultraviolet rays 63. This surface treatment enhances bondability in the LCP powder and bondability between the resin film containing the LCP as a main material and the LCP powder when a plurality of composite sheets are stacked, heated and compressed, and thus integrated to form a resin multilayer substrate, as will be described later (see FIG. 22 to FIG. 24). This enhances the resin multilayer substrate's interlayer close adhesion. Note that for example ethanol, terpineol, butyllactone, isopropyl alcohol, etc. may be used as a dispersion medium to provide a dispersion liquid of the LCP powder, which may in turn be treated with a powder plasma treatment apparatus. As the surface treatment for LCP powder 61, a method described in International Publication WO2014/109199 can be used, for example.

Figure 5:
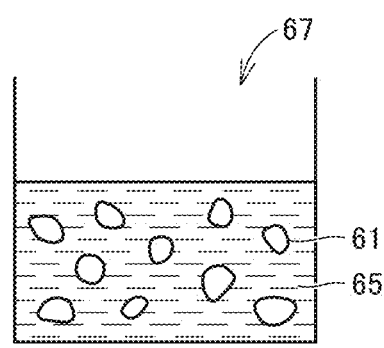
FIG. 5 shows a paste used in the method for producing the composite sheet according to the first preferred embodiment of the present invention.

Whether LCP powder 61 may undergo the surface treatment or not, as shown in FIG. 5, it is mixed with dispersion medium 65 and kneaded to prepare a paste 67.

Figure 6:
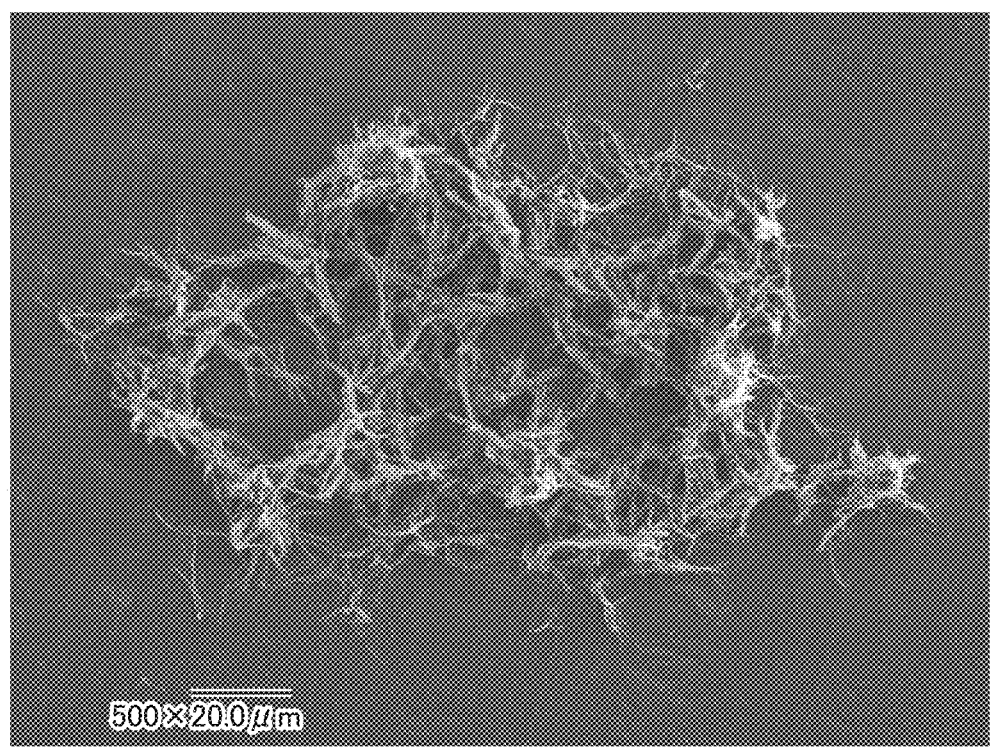
FIG. 6 is a photographic image of a fibrillated LCP powder used in the method for producing the composite sheet according to the first preferred embodiment of the present invention.

Preferably, at least a portion of the LCP powder included in paste 67 is fibrillated. Thus, fibrils tangled together or interacting with each other enhance a coating in strength after paste 67 is dried, and thus prevent the LCP powder from easily coming off. An example of the fibrillated LCP powder is shown in FIG. 6. The fibrillated LCP powder may be mixed with a non-fibrillated LCP powder and thus used. Note that when the fibrillation LCP powder made into a paste is compared with the non-fibrillated LCP powder, the former more easily maintains some viscosity and also significantly reduces or prevents sedimentation of the LCP powder. Accordingly, by appropriately mixing the fibrillated LCP powder and the non-fibrillated LCP powder together, the paste is adjusted to have a desired value in viscosity to allow the paste to be easily handled.

"Fibrillated LCP powder" includes fibrillated LCP particles. A "fibrillated LCP particle" is a particle which includes a liquid crystal polymer including a large number of fibrils (e.g., fibrillary fibrous branches, a networked structure composed of fibrils, etc.), and refers to a particle entirely, substantially fibrillated. In other words, it excludes an LCP flake partially having branches of fibrils extending therefrom.

Since the fibrillated LCP powder contains LCP particles having a large number of fibrils, it has a large number of gaps in a vicinity of a surface thereof and will thus have a low bulk density. The fibrillated LCP powder as a whole has a bulk density preferably of about 0.01 to about 0.2, more preferably about 0.03 to about 0.08, for example.

In order to further enhance bondability of the LCP particles and bondability of the LCP particles and the LCP sheet, the fibrillated LCP powder may at least partially undergo a surface treatment by exposure to ultraviolet (UV) rays or a plasma, similarly as done for LCP powder 61. Note that a surface treatment by ultraviolet rays is more preferable than that by a plasma since the former more effectively enhances bondability.

The fibrillated LCP powder can be obtained by the method described in International Publication WO2014/188830, for example.

Note that preferably, at least a portion of the LCP powder is obtained by crushing a biaxially oriented liquid crystal polymer sheet. By thus using the biaxially oriented liquid crystal polymer sheet, powdery LCP powder, rather than fibrous LCP powder, is able to be easily obtained.

Hereinafter, each step of the method for producing the composite sheet according to the present preferred embodiment will be described more specifically.

Figure 7:
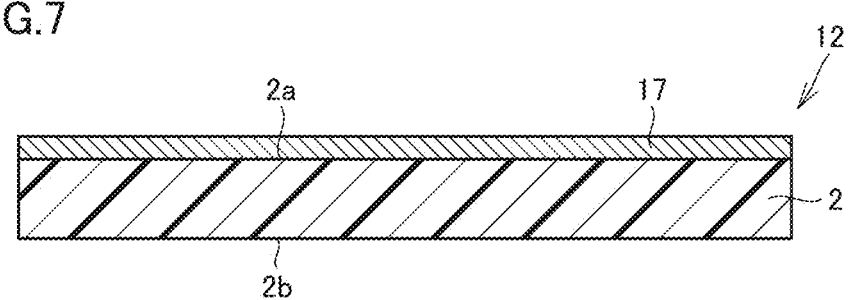
FIG. 7 illustrates a first step of the method for producing the composite sheet according to the first preferred embodiment of the present invention.

Initially, as step S1, a resin sheet 12 with a conductor foil as shown in FIG. 7 is prepared. Resin sheet 12 with the conductor foil is a sheet in which a conductor foil 17 adheres to one surface of resin layer 2. Resin layer 2 is composed of a thermoplastic resin. The thermoplastic resin as referred to herein is an LCP. While as a material of resin layer 2 in addition to the LCP, PEEK (polyetheretherketone), PEI (polyether imide), PPS (polyphenylene sulfide), thermoplastic PI (polyimide), etc. are primarily considered, herein, a material of resin layer 2 is the LCP.

Conductor foil 17 preferably is composed of Cu and has a thickness of about 18 μm, for example. Conductor foil 17 covers one surface of resin layer 2. Conductor foil 17 preferably has a surface with a surface roughness Rz of about 3 μm, for example. At a surface of resin layer 2 opposite to the surface thereof on which conductor foil 17 is formed, resin layer 2 has a surface exposed, and this surface preferably has a surface roughness Rz of about 1 μm to about 2 μm, for example.

Note that a material of conductor foil 17 may be Ag, Al, SUS, Ni, and Au other than Cu, and it may be an alloy of two or more different metals selected from of these metals. Conductor foil 17 is a conductor film. While according to the present preferred embodiment conductor foil 17 has a thickness of about 18 μm, conductor foil 17 may have a thickness of about 2 μm or more and about 50 μm or less, for example. Conductor foil 17 preferably has a thickness allowing a circuit to be provided.

Resin sheet 12 with the conductor foil corresponds to the "resin film" as referred to in step S1. More specifically, resin sheet 12 with the conductor foil is a resin film which includes a liquid crystal polymer as a main material, a first surface 2a and a second surface 2b facing away from each other, and a conductor foil 17 disposed on first surface 2a as a conductor film.

Figure 8:
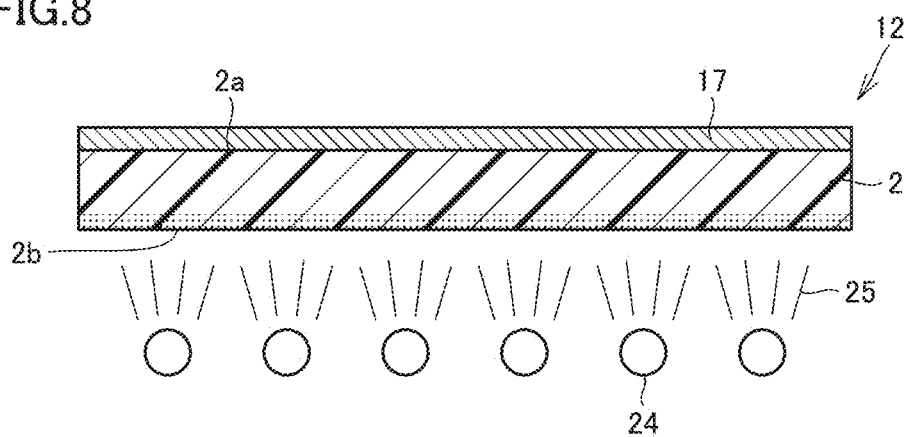
FIG. 8 illustrates a second step of the method for producing the composite sheet according to the first preferred embodiment of the present invention.
Figure 9:
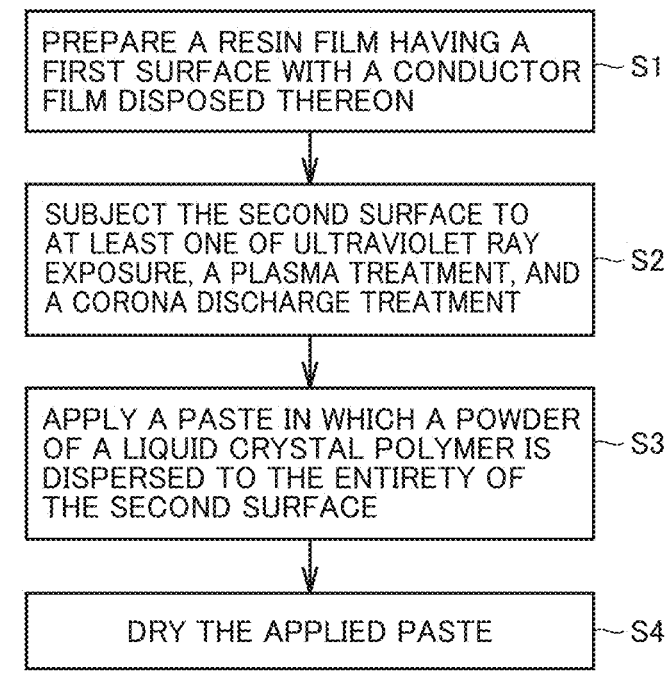
FIG. 9 is a flowchart of the method for producing the composite sheet according to the first preferred embodiment of the present invention in an exemplary variation.

Note that at this point in time, second surface 2b may undergo the surface treatment, as shown in FIG. 8. The surface treatment as referred to herein may be at least one of ultraviolet ray exposure, a plasma treatment, and a corona discharge treatment. In the example shown in FIG. 8, an ultraviolet lamp 24 is used to radiate ultraviolet rays 25 toward second surface 2b of resin layer 2. A flowchart when the surface treatment is thus performed is shown in FIG. 9. This surface treatment enhances bondability between resin sheets 12 each with a conductor foil and bondability between resin sheet 12 with the conductor foil and the LCP powder when a stack is compressed and heated, and thus integrated to form a resin multilayer substrate.

Thus, it is preferable that step S3 of applying is preceded by a step S2 of subjecting at least one of second surface 2b and the LCP powder to at least one of ultraviolet ray exposure, a plasma treatment, and a corona discharge treatment.

As step S3, the paste in which the LCP powder is dispersed is applied to the entirety of second surface 2b of resin layer 2, i.e., the resin film. The paste in which the LCP powder is dispersed is paste 67 shown in FIG. 5. Thus, as shown in FIG. 10, a paste layer 3 is formed to cover second surface 2b entirely.

As step S4, paste 67 applied to second surface 2b, i.e., paste layer 3, is dried. Thus, as shown in FIG. 11, a powder layer 4 is formed to cover second surface 2b entirely. Thus, a composite sheet 101 is obtained.

The method for producing a composite sheet according to the present preferred embodiment provides a composite sheet that reduces an amount of variation of a position of a conductive pattern attributed to a flow of resin during thermocompression bonding. This composite sheet will specifically be described later.

Second Preferred Embodiment

FIG. 11 shows a composite sheet according to a second preferred embodiment of the present invention.

Composite sheet 101 includes resin layer 2 defining and functioning as a resin film which includes an LCP as a main material and first surface 2a and second surface 2b facing away from each other; conductor foil 17 disposed on first surface 2a and defining and functioning as a conductor film; and powder layer 4 including an LCP powder as a main material and located on the entirety of second surface 2b.

The composite sheet according to the present preferred embodiment includes powder layer 4 on a surface thereof opposite to that on which the conductor film is located, and reduces an amount of variation of a position of a conductive pattern attributed to a flow of resin during stacking and thermocompression bonding. The ground thereof will be described with reference to FIG. 12 to FIG. 14.

Figure 12:
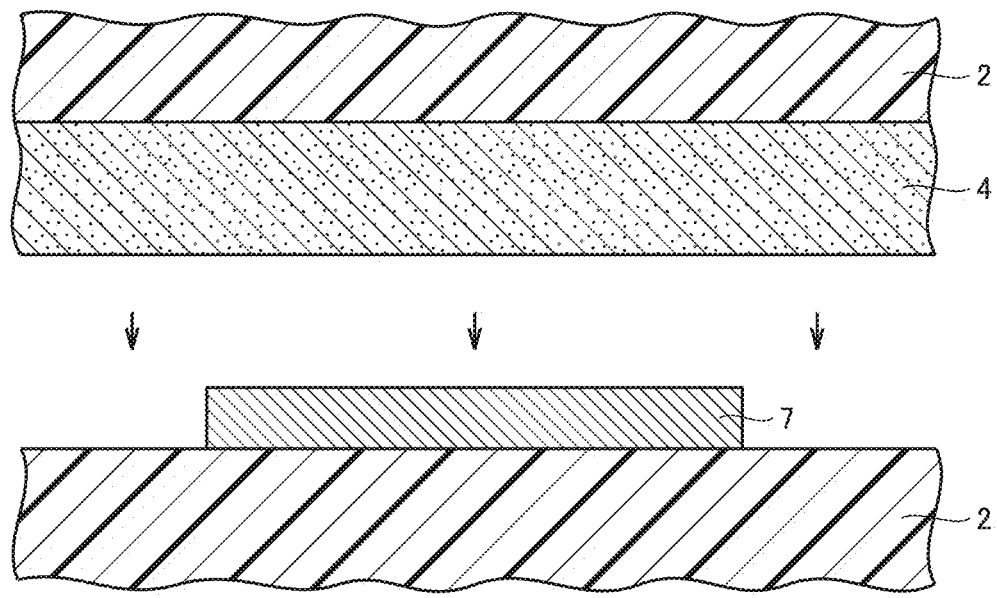
FIG. 12 is a first illustration of a phenomenon arising in a powder layer of the composite sheet according to the second preferred embodiment of the present invention.

FIG. 12 shows in an enlarged view of a vicinity of conductive pattern 7 when stacking composite sheets according to the present preferred embodiment. An upper composite sheet includes a lower surface provided with powder layer 4.

Figure 13:
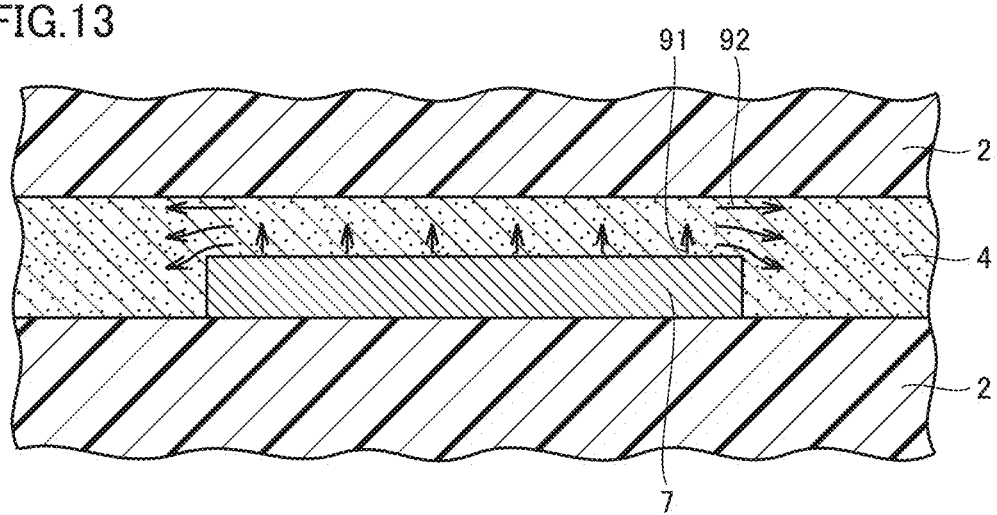
FIG. 13 is a second illustration of a phenomenon arising in a powder layer of the composite sheet according to the first preferred embodiment of the present invention.

Both are stacked one on the other, as shown in FIG. 13. In other words, conductive pattern 7 disposed on an upper surface of a lower composite sheet enters powder layer 4, as indicated by an arrow 91. Since powder layer 4 is mainly a collection of the LCP powder, a portion of powder layer 4 that overlaps conductive pattern 7 at least partially moves to a side to avoid conductive pattern 7.

Figure 14:
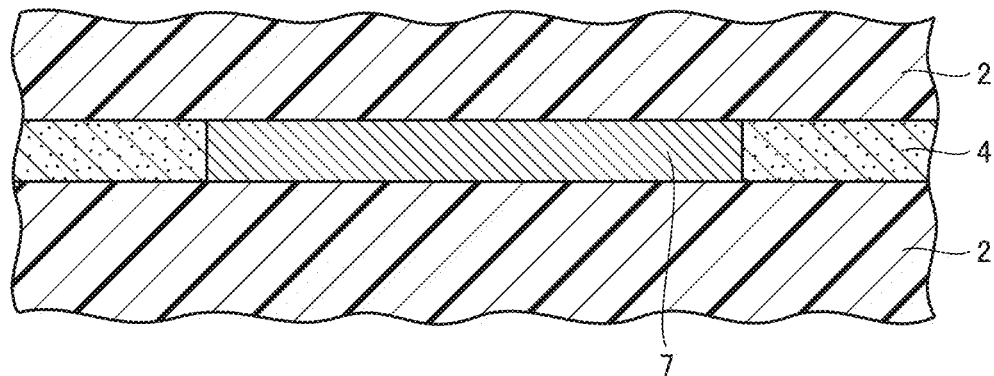
FIG. 14 is a third illustration of a phenomenon arising in the powder layer of the composite sheet according to the first preferred embodiment of the present invention.

Finally, a portion of powder layers 4 that is sandwiched by the upper and lower composite sheets is compressed as it is sandwiched, as shown in FIG. 14. Conductive pattern 7 is never directly pushed into the resin film (i.e., resin layer 2) on which conductive pattern 7 is formed, and deformation of the resin film (or resin layer 2) decreases. Thus, the position of conductive pattern 7 is stabilized and its undesirable positional variation is not easily caused.

As has already been set forth in describing the production method, it is preferable that at least one of second surface 2b and the powder included in powder layer 4 undergoes at least one of ultraviolet ray exposure, a plasma treatment, and a corona discharge treatment, since by adopting this configuration, at least one of second surface 2b and the powder is surface-modified, and adhesive strength (or bonding strength) after compression and heating is enhanced and the resin multilayer substrate is increased in reliability. It is more preferable that both second surface 2b and the powder included in powder layer 4 undergo such a surface treatment.

Preferably, at least a portion of the LCP powder included in powder layer 4 is fibrillated, since by adopting this configuration, powder layer 4 is further enhanced in adhesion strength. Furthermore, as has been discussed above, the fibrillated LCP powder has a low bulk density. Accordingly, in a case in which even if powder layer 4 has some thickness it includes the fibrillated LCP powder, a portion of powder layer 4 that overlaps conductive pattern 7 easily moves to a side to avoid conductive pattern 7.

At least a portion of the LCP powder included in powder layer 4 is obtained by crushing a biaxially oriented LCP sheet, since by adopting this configuration, a powdery LCP powder, rather than a fibrous LCP powder, is able to be easily obtained.

Third Preferred Embodiment

Figure 15:
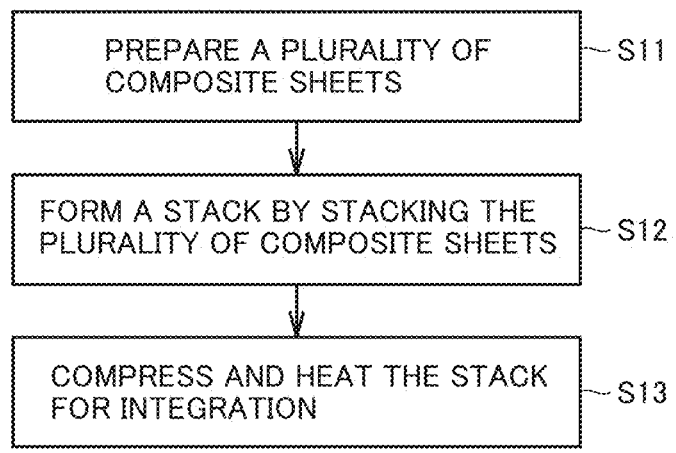
FIG. 15 is a flowchart of a method for producing a resin multilayer substrate according to a third preferred embodiment of the present invention.

With reference to FIG. 15 to FIG. 24, a method for producing a resin multilayer substrate according to a third preferred embodiment of the present invention will be described. A flowchart of the method for producing the resin multilayer substrate according to the present preferred embodiment is shown in FIG. 15.

The method for producing the resin multilayer substrate includes a step S11 of preparing a plurality of composite sheets; a step S12 of forming a stack by stacking a resin sheet group at least including the prepared plurality of composite sheets and each containing a liquid crystal polymer as a main material; and a step S13 of compressing and heating the stack to integrate the stack, the plurality of composite sheets each including a resin film which includes a liquid crystal polymer as a main material and a first surface and a second surface facing away from each other; a conductor film disposed on the first surface; and a powder layer including a powder of a liquid crystal polymer as a main material and provided on the entirety of the second surface. In step S12 of stacking, the conductor film has at least a portion overlapping the powder layer.

Figure 16:
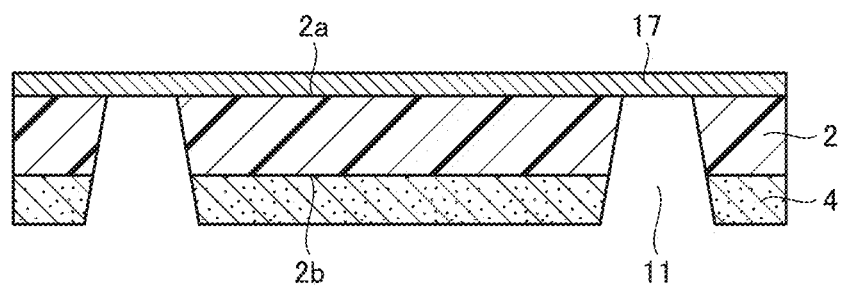
FIG. 16 illustrates a first step of the method for producing the resin multilayer substrate according to the third preferred embodiment of the present invention.

As step S11, two or more composite sheets 101 as shown in FIG. 11 are prepared. If necessary, as shown in FIG. 16, a via hole 11 is formed in the composite sheet. Processing to form via hole 11 can be performed by irradiating with carbon dioxide gas laser light, for example. While via hole 11 penetrates resin layer 2, via hole 11 does not penetrate conductor foil 17. Subsequently, a chemical agent such as permanganic acid is used in a treatment to remove smear (not shown) of via hole 11, if necessary. In order to form via hole 11, carbon dioxide gas laser light is preferably used. However, a different type of laser light may be used. Furthermore, in order to form via hole 11, a method other than laser light irradiation may be adopted.

Figure 17:
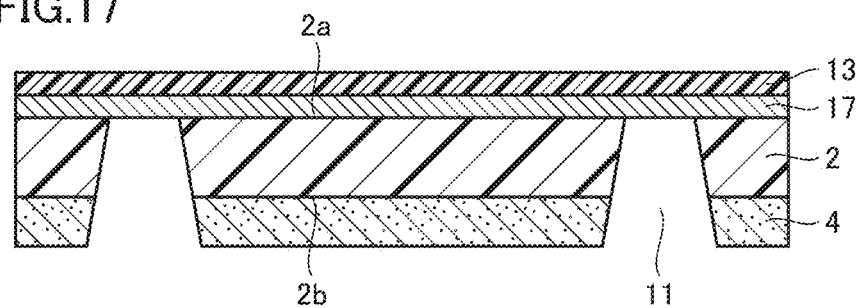
FIG. 17 illustrates a second step of the method for producing the resin multilayer substrate according to the third preferred embodiment of the present invention.
Figure 18:
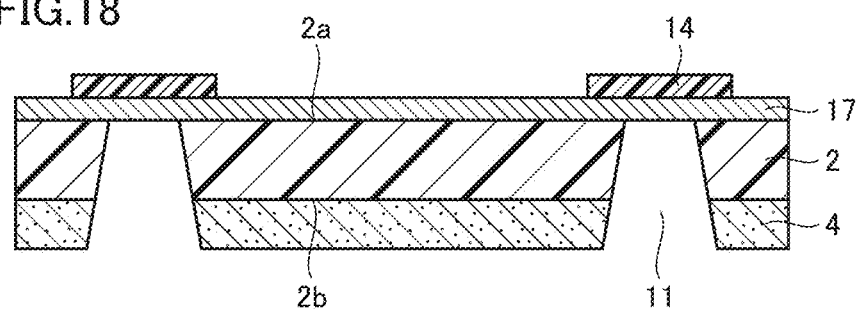
FIG. 18 illustrates a third step of the method for producing the resin multilayer substrate according to the third preferred embodiment of the present invention.

Subsequently, as shown in FIG. 17, a resist layer 13 is formed on a surface of conductor foil 17 of composite sheet 101. Resist layer 13 is formed, for example, by lamination. As shown in FIG. 18, a resist pattern 14 is formed from resist layer 13 by exposure using a photomask.

Figure 19:
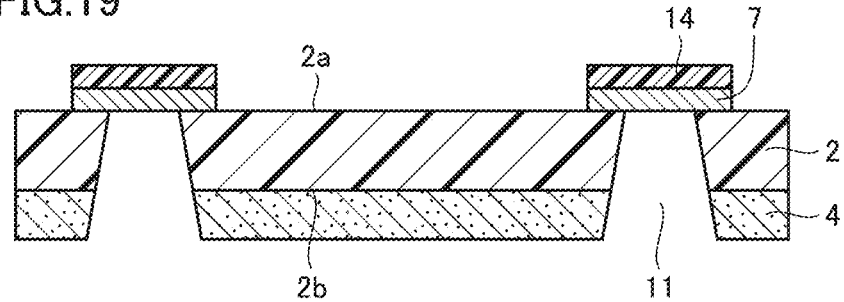
FIG. 19 illustrates a fourth step of the method for producing the resin multilayer substrate according to the third preferred embodiment of the present invention.
Figure 20:
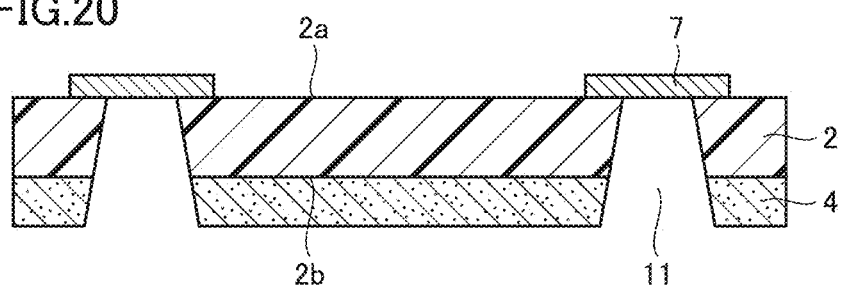
FIG. 20 illustrates a fifth step of the method for producing the resin multilayer substrate according to the third preferred embodiment of the present invention.

Subsequently, etching is done with resist pattern 13 used as a mask to remove a portion of conductor foil 17 that is not covered with resist pattern 13, as shown in FIG. 19. A portion of conductor foil 17 that remains after the etching will hereinafter be referred to as a "conductive pattern 7." Subsequently, as shown in FIG. 20, resist pattern 13 is removed. Thus, conductive pattern 7 as desired is obtained on first surface 2a of resin layer 2. Conductive pattern 7, after assembled to form the resin multilayer substrate, defines and functions, for example, as an internal interconnect, an inductive conductor, a capacitive conductor, etc. While FIG. 20 shows a plurality of conductive patterns 7 equal in size, in reality, a plurality of conductive patterns 7 may be formed differently in size, as required.

Figure 21:
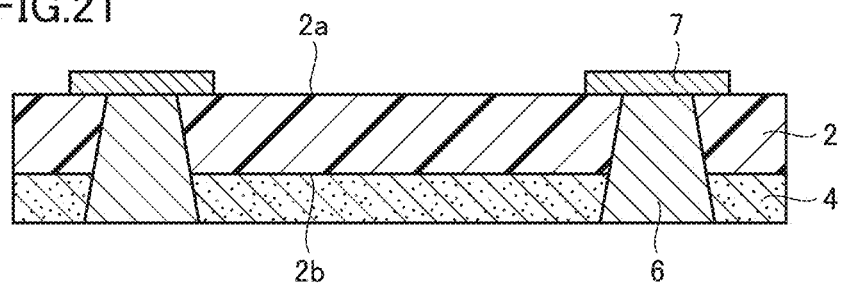
FIG. 21 illustrates a sixth step of the method for producing the resin multilayer substrate according to the third preferred embodiment of the present invention.

Subsequently, as shown in FIG. 21, via hole 11 is filled with a conductive paste by screen printing or the like. The screen printing is performed at a lower side as seen in FIG. 20. While FIG. 20 and FIG. 21 show via hole 11 in a position facing downward for the sake of illustration, in reality, the screen printing may be done with the position of the via hole changed as appropriate.

While the filling conductive paste may contain copper, tin or the like as a major component, it may instead contain silver as a major component, for example. Preferably, the conductive paste contains in an appropriate amount such a powdery metal that forms an alloy layer with a metal which is a material of conductive pattern 7 at a temperature applied subsequently when stacked resin layers undergo thermocompression bonding (hereinafter referred to as a "thermocompression bonding temperature"). Since this conductive paste contains copper, or Cu, as a major component to exhibit conductance, it is preferable that this conductive paste include at least one type of Ag, Cu and Ni and at least one type of Sn, Bi and Zn other than the major component. Thus, by introducing the conductive paste, a conductor via 6 is formed.

Note that while in the above example via hole 11 is initially formed followed by forming conductive pattern 7 followed by forming conductor via 6, this order is not exclusive. For example, conductive pattern 7 may initially be formed followed by forming via hole 11 followed by forming conductor via 6.

Figure 22:
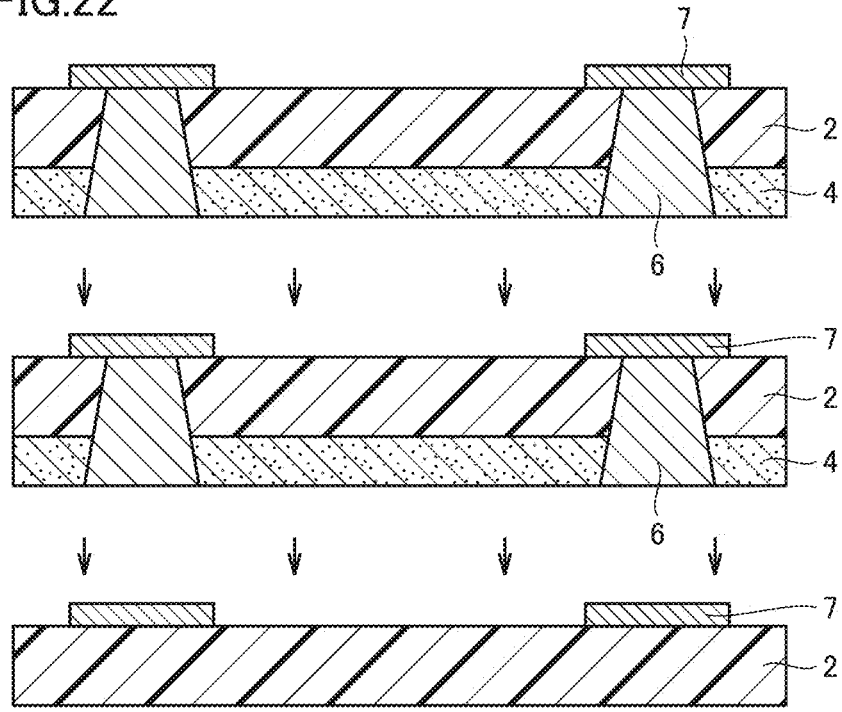
FIG. 22 illustrates a seventh step of the method for producing the resin multilayer substrate according to the third preferred embodiment of the present invention.

Subsequently, as step S12, as shown in FIG. 22, a plurality of composite sheets are stacked. Thus, a stack 1 is formed as shown in FIG. 23.

Figure 23:
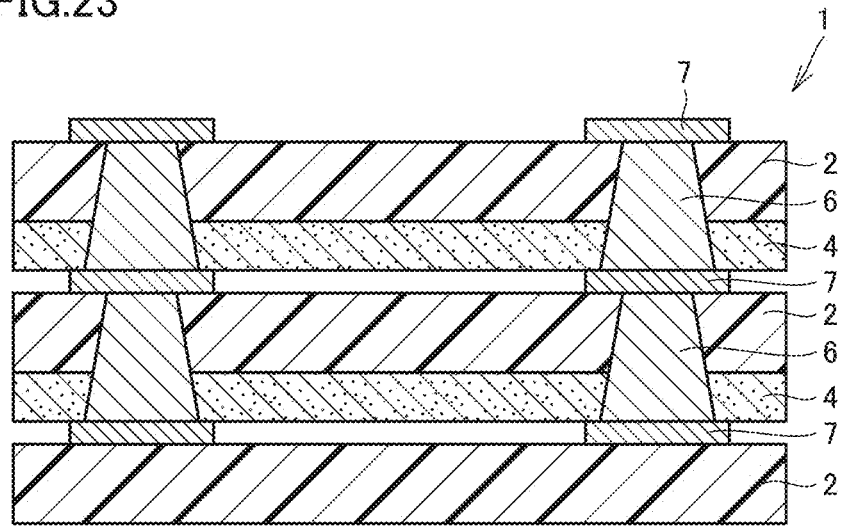
FIG. 23 illustrates an eighth step of the method for producing the resin multilayer substrate according to the third preferred embodiment of the present invention.

Note that, in the example shown in FIG. 22 and FIG. 23, two composite sheets and one resin sheet (or resin layer) are stacked. More specifically, two resin sheets each having powder layer 4 and one resin sheet which does not have powder layer 4 are combined and thus stacked together. However, this is only indicated as one example for illustration, and the combination is not limited thereto. The total number of sheets stacked is not limited to that indicated herein, and more or less sheets may be stacked. It is not necessary to form a stack only of composite sheets, and stack 1 including one or more composite sheets suffices. While in the example shown in FIG. 22 and FIG. 23, the resin sheet which does not have powder layer 4 preferably is disposed only at a bottommost layer, this is merely one example. The position at which the resin sheet which does not have powder layer 4 is disposed is not necessarily the bottommost layer.

Figure 24:
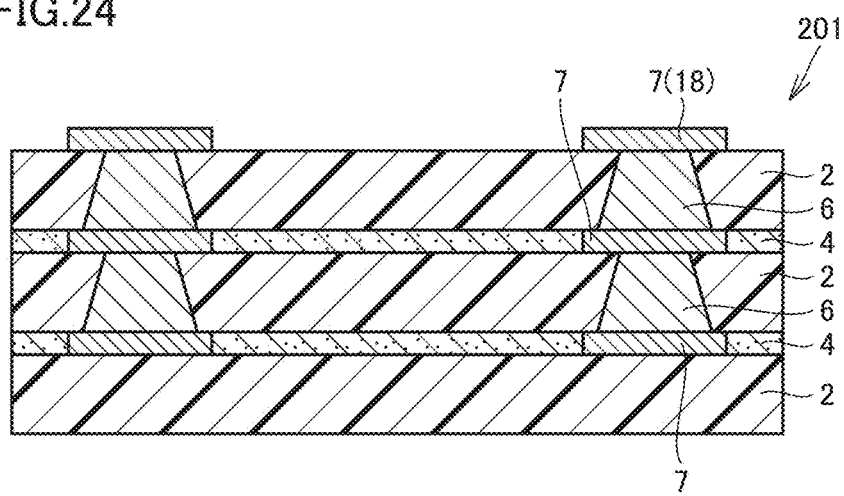
FIG. 24 illustrates a ninth step of the method for producing the resin multilayer substrate according to the third preferred embodiment of the present invention, and is a cross section of a resin multilayer substrate according to a fourth preferred embodiment of the present invention.

As step S13, by compressing and heating stack 1 to integrate it, as shown in FIG. 24, a resin multilayer substrate 201 is obtained. In this compression and heating, simultaneously, the conductive paste having been introduced as conductor via 6 may be solidified (or metalized).

The method for producing a resin multilayer substrate according to the present preferred embodiment reduces an amount of variation of a position of a conductive pattern attributed to a flow of resin during thermocompression bonding, and produces a resin multilayer substrate with precision.

Preferably, the method for producing a resin multilayer substrate according to the present preferred embodiment is performed such that, in step S12 of stacking to form a stack or step S13 of integrating, a portion of powder layer 4 that overlaps conductive pattern 7 defining and functioning as a conductor film at least partially moves to a side to avoid conductive pattern 7, since this allows powder layer 4 and conductive pattern 7 to have a uniform total thickness to significantly reduce or prevent displacement of conductive pattern 7.

In the method for producing a resin multilayer substrate according to the present preferred embodiment, preferably, at least a portion of the LCP powder included in powder layer 4 is fibrillated, since this enhances adhesion thereof to resin layer 2 composed mainly of the LCP. As has been discussed above, it is preferable that, as the LCP powder included in powder layer 4, a fibrillated LCP powder be at least partially included. Furthermore, it is particularly preferable that the fibrillated LCP powder be mixed with a non-fibrillated LCP powder, as appropriate, and thus used.

In the method for producing a resin multilayer substrate according to the present preferred embodiment, preferably, at least a portion of the LCP powder included in powder layer 4 is obtained by crushing a biaxially oriented LCP sheet, since by thus using the biaxially oriented LCP sheet, an LCP powder of a good quality is able to be obtained.

Fourth Preferred Embodiment

With reference to FIG. 24, a resin multilayer substrate according to a fourth preferred embodiment of the present invention will be described. Resin multilayer substrate 201 according to the present preferred embodiment includes a structure stacked to include one or more sheets of any of the above described composite sheets.

Resin multilayer substrate 201 according to the present preferred embodiment produced using a composite sheet having been described in the previous preferred embodiments reduce an amount of variation of a position of a conductive pattern attributed to a flow of resin during thermocompression bonding. Accordingly, a significantly reliable resin multilayer substrate can be produced.

Exemplary Experiment

In order to verify advantageous effects of preferred embodiments of the present invention, a non-limiting experiment conducted by the inventors will be described. A 125-μm-thick, biaxially stretched LCP film was used as a raw material for a fibrillated LCP powder. This film was primarily crushed using a rotary cutter mill. In the primary crushing, only what was crushed to pass through a sieve having a diameter of 3 mm was collected. The primarily crushed film was further, secondarily crushed using a freezing and crushing machine to obtain an LCP powder.

The obtained LCP powder has a passage rate (in weight) of 22% for a 40 μm mesh, a passage rate (in weight) of 67% for a 106 μm mesh, and a passage rate of 90% for a 150 μm mesh.

Subsequently, the LCP powder sieved through the 150 μm mesh was used and fibrillated using a high pressure wet shredding apparatus. As a dispersion medium, a 20% aqueous solution of ethanol was used, and the LCP powder was added at a weight ratio 5%. The high pressure wet shredding apparatus has a nozzle which is a cross type nozzle having a diameter of 250 μm, and passing through the nozzle was done 10 times with a pressure of 200 MPa applied. The obtained dispersion liquid was further diluted with a 20% aqueous ethanol solution to have a solid content with a weight ratio of 2% and underwent an ultraviolet ray treatment in a method described in International Publication WO2014/109199, and thereafter was dried with a spray dryer to obtain a fibrillated powder in the form of a powdery matter.

This powdery matter was added to butanediol (viscosity: about 90 mPa·s) at a weight ratio of 8% and furthermore, the LCP powder obtained by freezing and crushing that was sieved through the 40 μm mesh, and then underwent an ultraviolet ray treatment in a method described in International Publication WO 2014/109199, was added at a weight ratio of 8%, and the intermediate product was agitated to obtain a pasty matter. The obtained pasty matter had a viscosity of about 10000 mPa·s. This pasty matter was allowed to stand for 1 day, and there was no solid content observed sedimented.

An LCP base material having a thickness of 18 μm with a 18-μm-thick copper foil stuck thereon had a surface thereof opposite to the copper foil subjected to an ultraviolet ray treatment to have bondability, and subsequently, the above described pasty matter was applied by screen printing (70 screen meshes/inch (about 27.6 meshes/cm), and an aperture of 263 μm) to provide a coating. Subsequently, the coating was dried on a hot plate at 250° C. for 5 minutes. Thus, an LCP base material sheet (a composite sheet) with a coating composed of a mixture of fibrillated LCP powder and non-fibrillated LCP powder and having a thickness of about 30 μm was obtained. The obtained coating had a sufficient strength and a sufficient adhesiveness to a substrate so that it does not peel or come off when forming an interconnect by a subtractive method.

Figure 25:
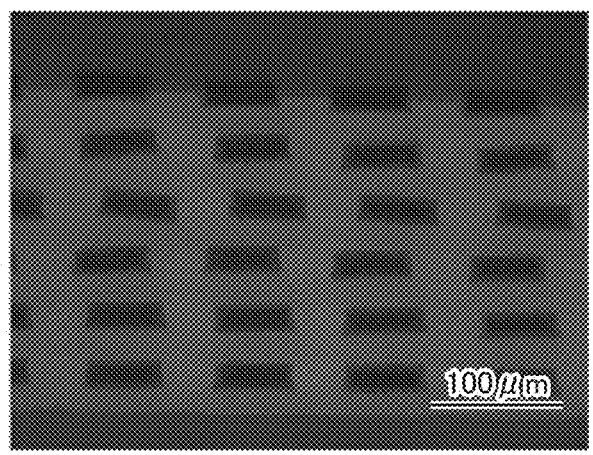
FIG. 25 is a cross-sectional photographic image of a resin multilayer substrate produced as a sample 1.

As a sample 1, on the copper foil of the LCP base material sheet with the above described coating provided thereon, an interconnect of L/S=50/25 was formed in the subtractive method, and six such sheets were stacked, and compressed and heated to produce a resin multilayer substrate. This resin multilayer substrate is structured such that by the copper foil a conductive pattern imitating a circuit is disposed inside. In the heating and compressing step, a vacuum press apparatus was used to perform a press at 280° C. and 4 MPa for 5 minutes. The obtained resin multilayer substrate's cross-sectional photographic image is shown in FIG. 25.

Figure 26:
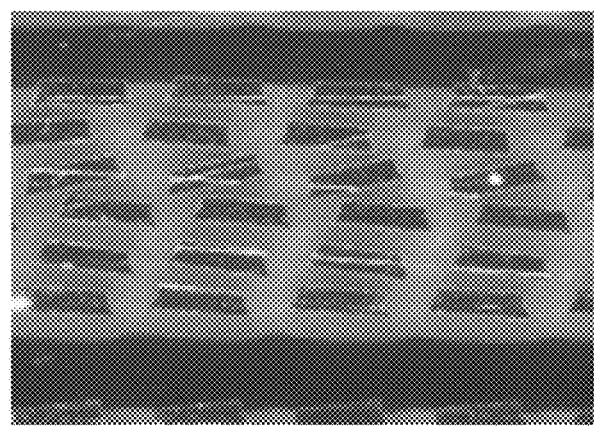
FIG. 26 is a cross-sectional photographic image of a resin multilayer substrate produced as a comparative example 1.

As a comparative example 1, an LCP base material sheet which did not have the above described coating on a surface thereof opposite to the copper foil was used to form a resin multilayer substrate in a similar method. The obtained resin multilayer substrate's cross-sectional photographic image is shown in FIG. 26.

In the comparative example a portion of an internal conductive pattern was significantly displaced and arranged in a disturbed manner, whereas in sample 1 the internal conductive pattern's arrangement had only a small disturbance. From this, it has been confirmed that preferred embodiments of the present invention achieve advantageous effects.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite sheet comprising:
   a resin film including a liquid crystal polymer as a main material and a first surface and a second surface facing away from each other;
   a conductor film disposed on the first surface; and
   a powder layer including a powder of a liquid crystal polymer as a main material and located on an entirety of the second surface.

2. The composite sheet according to claim 1, wherein at least one of the second surface and the powder included in the powder layer is made of at least one of an ultraviolet ray exposed material, a plasma treated material, and a corona discharged material.

3. The composite sheet according to claim 1, wherein at least a portion of the powder included in the powder layer is fibrillated powder.

4. The composite sheet according to claim 1, wherein at least a portion of the powder included in the powder layer is made of a crushed biaxially oriented liquid crystal polymer sheet material.

5. A resin multilayer substrate comprising:
   a stack of composite sheets; wherein
   each of the composite sheets includes:
     a resin film including a liquid crystal polymer as a main material and a first surface and a second surface facing away from each other;
     a conductor film disposed on the first surface; and
     a powder layer including a powder of a liquid crystal polymer as a main material and located on an entirety of the second surface.

6. The resin multilayer substrate according to claim 5, wherein at least one of the second surface and the powder included in the powder layer is made of a least one of an ultraviolet ray exposed material, a plasma treated material, and a corona discharged material.

7. The resin multilayer substrate according to claim 5, wherein at least a portion of the powder included in the powder layer is fibrillated powder.

8. The resin multilayer substrate according to claim 5, wherein at least a portion of the powder included in the powder layer is made of a crushed biaxially oriented liquid crystal polymer sheet material.

* * * * *